(12) United States Patent
Fujii et al.

(10) Patent No.: US 6,395,240 B1
(45) Date of Patent: May 28, 2002

(54) CARRIER BOX FOR SEMICONDUCTOR SUBSTRATE

(75) Inventors: Toshiaki Fujii; Osamu Horita, both of Kanagawa (JP)

(73) Assignee: Ebara Corporation, Tokyo (JP)

(*) Notice: Subject to any disclaimer, the term of this patent is extended or adjusted under 35 U.S.C. 154(b) by 0 days.

(21) Appl. No.: 09/555,381

(22) PCT Filed: Nov. 30, 1998

(86) PCT No.: PCT/JP98/05368
§ 371 (c)(1),
(2), (4) Date: May 30, 2000

(87) PCT Pub. No.: WO99/28966
PCT Pub. Date: Jun. 30, 1999

(30) Foreign Application Priority Data

Nov. 28, 1997 (JP) ............................................. 9-341893
Mar. 4, 1998 (JP) ............................................. 10-67625
Sep. 28, 1998 (JP) ............................................. 10-288702

(51) Int. Cl.[7] .............................................. B01J 19/08

(52) U.S. Cl. .................................................. 422/186.3

(58) Field of Search ..................................... 422/186.3

(56) References Cited

U.S. PATENT DOCUMENTS

| 5,240,753 A | * | 8/1993 | Tabuchi et al. ............. 206/328 |
| 5,380,503 A | * | 1/1995 | Fujii et al. ................. 422/186.3 |
| 5,843,196 A | * | 12/1998 | Leavy et al. ................ 206/710 |

FOREIGN PATENT DOCUMENTS

| JP | 01-266864 |   | 10/1989 |
| JP | 4-179146 A | * | 6/1992 |
| JP | 4-218941 A | * | 8/1992 |
| JP | 6-029373 A | * | 2/1994 |

* cited by examiner

Primary Examiner—Kishor Mayekar
(74) Attorney, Agent, or Firm—Oblon, Spivak, McClelland, Maier & Neustadt, P.C.

(57) ABSTRACT

A carrier box 21 for a semiconductor substrate, including an opening and closing mechanism for taking the semiconductor in or out of the box 21. The box 21 is provided with a gas cleaning device A-2 which uses a photo-electron or the photo-catalyst actuated by light irradiation for cleaning an inside of the box, or a gas cleaning unit including the gas cleaning device and a rechargeable battery for supplying the gas cleaning device with electricity and integrated into the gas cleaning unit, and thereby providing a practically efficient function to remove particles or gaseous harmful components.

4 Claims, 9 Drawing Sheets

CARRIER BOX FOR SEMICONDUCTOR SUBSTRATE

This application is a 35 U.S.C. 371 National Stage filing of PCT/JP98/05368 filed Nov. 30, 1998.

FIELD OF THE INVENTION

The present invention relates generally to a carrier box for a semiconductor substrate, and in particular to a carrier box for receiving and carrying a substrate including a Si wafer, a glass substrate, a metal coated substrate or the like used in industries, such as the semiconductor industry, liquid crystal industry and precision machinery industry.

BACKGROUND OF THE INVENTION

Air cleaning in a conventional clean room will be described with reference to FIG. 18 taking a case of air cleaning in a semiconductor manufacturing plant.

In FIG. 18, outside air 1 is passed through a pre-filter 2 to remove coarse particles, air-conditioned by an air-conditioner 3 and dedusted by a medium efficiency particulate air filter 4. Then small particles are removed by HEPA (high efficiency particulate air) filter 6 installed on a ceiling of a clean room 5 so that cleanliness class of 100 to 1,000 may be maintained in the clean room 5 (see "Clean Design" pp. 11–24, summer of 1988). Each of reference numerals 7-1, 7-2 respectively designates a fan and an airflow is shown by arrows.

A conventional clean room is configured as shown in FIG. 18 since air cleaning therein purposes to remove particles. Though effective in removing particles, this configuration is of no effect in removing gaseous harmful components.

In addition, a large clean room as shown in FIG. 18 has a disadvantage in that it is excessively expensive to accomplish super cleanliness therein ("BREAK THROUGH" vol. 5, pp. 38–41, 1993).

It is of no doubt that, in the semiconductor industries, products will be continuously and increasingly required to be of higher quality and precision, and accordingly not only particles (particulate material) but also a gaseous material will be seriously regarded as a contaminant. That is, control of gaseous material (gaseous harmful component) will gain in importance while at present, removal of only particles is required. A conventional filter for a clean room as shown in FIG. 18 removes only particles, and a gaseous harmful component in outside air is introduced into a clean room without being removed thereby giving rise to a potential problem.

That is, in a clean room, adding to the particles (particulate material), a gaseous material such as an exhaust gas of automobile which cannot be collected and removed by a conventional dedusting filter (e.g. HEPA or ULPA filter) and is consequently introduced into the clean room, an organic gas or so-called hydro-carbon (H.C.) generated by an outgassing from a high molecular synthetic resin material which is extensive use, or a basic (alkaline) gas such as amine will become problematic as a gaseous harmful component.

Among these materials, H.C. is required to be removed since it causes contamination, even if it is of extremely low concentration in a normal atmosphere (indoor or outdoor air).

Recently, outgassing from high molecular synthetic resins of structural members of the clean room and instruments used therein (e.g. wafer storage box) has been discussed as a source of H.C. ("1994 Annual Report of Japan Machinery Federation" pp. 41–49, March of 1995).

The gaseous material generated by operation in a clean room also is problematic. That is, since a gaseous material generated in a clean room is added to that introduced thereinto from outside air (because the gaseous material cannot be removed by the filter of the clean room, gaseous material in the outside air is introduced thereinto) as a cause of origination of the gaseous material in a normal clean room, the gaseous material reaches a higher concentration in the clean room as compared with that in the outside air, and contaminates a base material of a wafer or a substrate.

That is, when the above contaminants (particles or gaseous harmful components) attach to a surface of a wafer or a partially or completely finished product, such contaminants may cause a breakage or short-cut in a circuit (pattern) on the surface of the substrate resulting in a failure. On the other hand, among gaseous materials, ① attaching to a surface of the wafer (substrate), H.C. increases a contact angle and affects an affinity (conformability) between the substrate and a resist. Deterioration of the affinity has a negative effect on a film thickness of the resist and on adhesion between the substrate and the resist ("Air Cleaning" vol. 33, No. 1, pp. 16–21, 1995). In addition, H.C. cause a pressure resistance deterioration (deterioration in reliability) of an oxide film of the wafer (Proceedings of the 39th Joint Lecture Meeting of Japan Society of Applied Physics, p. 686, 1992). ② $NH_3$ causes a formation of ammonium salt and resulting a blooming on the wafer (deterioration in resolution) ("The Newest Technology Course—Materials—Semiconductor Process Seminar, Oct. 29, 1996" pp. 15–25, Realise Corp., 1996).

Consequently, not only particles but also gaseous contaminants lower the productivity (yield) of the semiconductor products.

Especially, due to the causes of generation described above and further because of the promotion of air circulation in a clean room in recent years with a view to saving energy, the gaseous materials as gaseous harmful components in a clean room become condensed to a significantly higher concentration than that present in outside air, and attach to a base material or substrate and contaminate the surface thereof. A degree of contamination can be represented by the contact angle of the basic material or the substrate, that is, a greater contamination results in a larger contact angle. In a base material or substrate having a large contact angle, even if a film is formed thereon, an adhesive strength of the film is not sufficient (low conformability), and a lower yield results.

The term "contact angle" used herein means a contact angle of wettability by a water and represents a degree of contamination on the surface of a substrate. That is, when a hydrophobic (oily) contaminant is attached to the surface of a substrate, the surface repels water, making it harder for it to be wetted. This results in an increased contact angle. Accordingly, a large contact angle indicates high contamination while a low contact angle indicates low contamination.

Especially, because recently air in a clean room is circulated to save energy, an amount of the gaseous harmful components in a clean room gradually increase and contaminate a base material and substrate.

As a measure to protect a substrate from contamination by these contaminants, (1) transportation by a robot is effective. That is, since a person is a source of dust and gas, it is important to exclude any interposition thereof in order to maintain the cleanliness ("Monthly Semiconductor World, January" pp. 112–116, 1997), (2) From a viewpoint of cleaning, it is proposed that, in a future space cleaning, a local cleaning (mini environment) in which a clean space is limited (localized) will be effective (① "Nikkei Microdevices, July", pp. 136–141, 1995, ② "Proceedings of IES", pp. 373–378, 1994).

Presently, though a system in which a Si wafer is received in a synthetic resin (plastic) box to be transported is being investigated as a mini environment, it is reported that (1) when unexpected dusting occurs within the box, particle contamination might become more serious, (2) a countermeasure for outgassing (gas generation) from the box material is required, and (3) a periodical cleaning process of the box itself is required because of (1) and (2) described above, which adds some complexity and causes some problems in practical use ("KANOMAX Aerosol Seminar", pp. 1–10, 1996).

In the light of these problems, the inventors of the present invention have proposed a space cleaning system using a photo-electron or a photo-catalyst as a technology for local cleaning.

For example, 1) "Cleaning System by Photo-electron (removal of particulate materials)" is disclosed in Japanese Patent Publication No. Hei 3-5859; Japanese Patent Publication No. Hei 6-74909; Japanese Patent Publication No. Hei 8-211; and Japanese Patent Publication No. Hei 7-121369, 2) "Cleaning System by Photo-catalyst (removal of gaseous harmful components)" is disclosed in Japanese Patent Laid-open Publication No. Hei 9-168722; and Japanese Patent Laid-open Publication No. Hei 9-205046, and 3) "Combined system of Photo-electron and Photo-catalyst (simultaneous removal of particles and gases)" is disclosed in Japanese Patent No. 2623290.

These cleaning systems are effective depending on a type of object (or a kind of equipment to which these system are applied) or on a level of required performance, but in some cases usage thereof must be improved.

In making such improvements, there are some problems involved in making these systems more effective in their practical use. One of these problems arises from the fact that these systems make a gas clean by a flow method using heat generated by a light source of ultraviolet rays or the like. That is, depending on the type of object to which these systems are applied, it is important how to make the gas flow more effective and this includes a problematic mater to be improved.

Accordingly, in the light of the prior arts described above, the present invention provides a carrier box for a semiconductor substrate having a function to remove particles and gaseous harmful materials, which is effective in a practical use as a semiconductor substrate carrier box comprising a mini environment which is increasingly desired in industries such as semiconductor, liquid crystal or precise machinery industries, as the products thereof are required to be of more increasingly high quality, precision and have highly fine microstructures.

SUMMARY OF THE INVENTION

In order to solve the problems described above, the present invention provides a carrier box for a semiconductor substrate having an opening and closing mechanism for taking the semiconductor substrate in or out the box, said carrier box characterized by comprising a gas cleaning unit formed by integrating into one unit a gas cleaning device which uses a photo-electron or a photo-catalyst actuated by light irradiation for cleaning the inside of the box.

The present invention further provides another carrier box for a semiconductor substrate having an opening and closing mechanism for taking the semiconductor substrate in or out the box, said carrier box characterized by comprising a gas cleaning unit formed by integrating into one unit a gas cleaning device which uses a photo-electron or a photo-catalyst actuated by light irradiation for cleaning the inside of the box and a rechargeable battery-type electric power source device for supplying the gas cleaning device with electricity.

Preferably, the carrier box is made of a synthetic resin and the gas cleaning unit is provided with a heat radiator for transmitting heat generated in the electric power source device to the gas cleaning device when the electric power source device is integrally included in the gas cleaning unit.

In addition, when the electric power source device is not integrally included in the gas cleaning unit, the gas cleaning unit is supplied with electricity by being connected to an electric power supply device installed in a load port, a stand-by station or a stocker during an interval of the transportation of the carrier box (while the carrier box is not in use) and then is operated.

There will now be described the present invention with respect to the attached drawings.

DETAILED DESCRIPTION OF THE INVENTION

Figure 1:
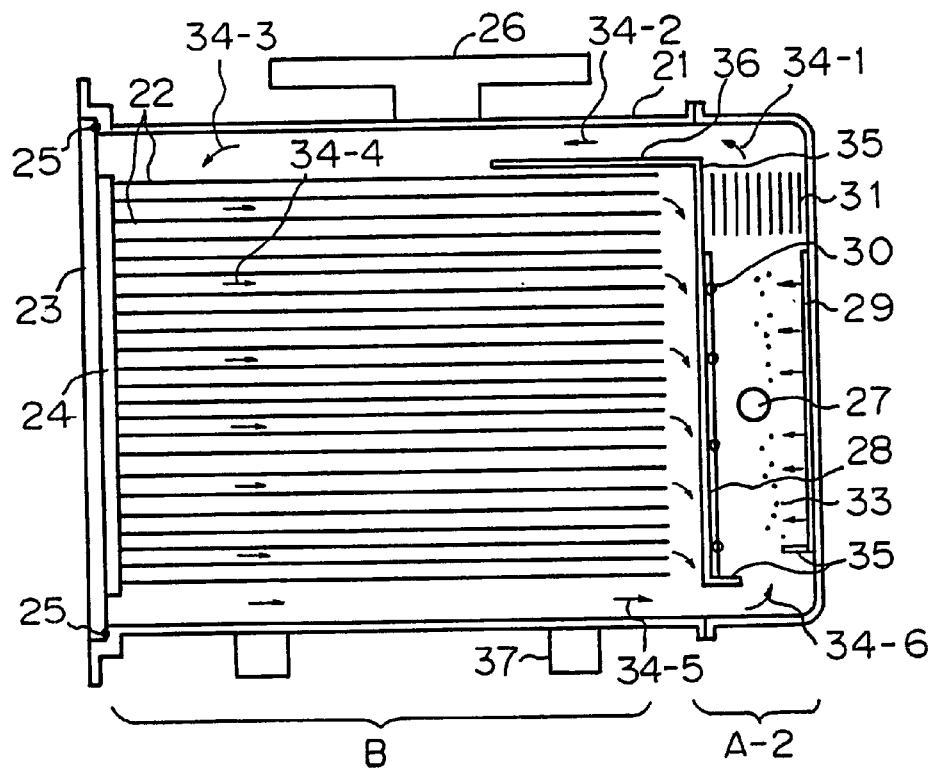
FIG. 1 is a cross sectional view illustrating an example of a side opening integral type carrier box of Reference No. 1.

A carrier box for a semiconductor substrate of the present invention has an opening and closing mechanism for allowing the semiconductor substrate to be taken into or out of the box and also integrally includes a gas cleaning device (gas cleaning unit) which uses a photo-electron or a photo-catalyst actuated by light irradiation for cleaning the inside of the box, wherein said unit can be detached from the box at need.

Said gas cleaning device is supplied with electricity by being connected to an electric power supply device installed in a load port, a stand-by station or a stocker during an interval between essential transportation services of the carrier box (while the carrier box is not in use) and is operated and thereby the gas in the box with the substrates received therein is made clean.

Further, another carrier box for a semiconductor substrate of the present invention has an opening and closing mechanism for allowing the semiconductor substrate to be taken into or out of the box and further includes a gas cleaning device which uses a photo-electron or a photo-catalyst catalyst actuated by light irradiation for cleaning an inside of the box and a rechargeable battery type electric power source device, wherein said gas cleaning device and said electric power source device are integrated into a gas cleaning unit and said unit can be detached from the box at need.

In addition, this unit may be equipped with a heat radiator for transmitting heat generated in the electric power source device to the gas cleaning device which uses the photo-electron or the photo-catalyst.

The boxes of the present invention may consist of any container so far as it can receive, transport and/or hold the semiconductor substrate and can be hermetically sealed. For example, it may be made of metal or a synthetic resin. Among metal materials, Al is preferable because of its light weight. In the case of synthetic resin materials, any material may be employed so far as it is superior in processing, rigidity and reliability and exhibits little outgassing, and preferably it is transparent. For example, general purpose plastics such as ABS or acrylic resin, engineering plastics such as polycarbonate (P.C.) and super engineering plastics such as polyetherimide may be employed.

The opening and closing mechanism of the box may be of any type so far as the box can be equipped with a gas cleaning device which uses the photo-electron or photo-catalyst catalyst of the present invention (described later), and can be hermetically sealed as described above, and also the substrate can be taken into or out of the box at need.

For example, the opening and closing mechanism of the box comprises a box door, a wafer retainer and a sealing member and is integrated into one unit, and the box door is released from a box main body by engaging the box door with a door opener (SEMI standard) and horizontally drawing it out of the box main body and then pulling it downward.

The box may be grouped, for example, into some classes based on a position of the opening and closing door and a receiving manner of the substrate (whether or not the substrate is received in an open cassette), including 1) a side opening integral type carrier box, 2) an open cassette container type side opening carrier box, and 3) an open cassette container type bottom opening carrier box.

Next, will be described the gas cleaning device which uses the photo-electron or the photo-catalyst and can be detached at need from the box equipped with the opening and closing mechanism described above, which is one of the features of the present invention.

This device is installed in a portion within the box so as to effectively remove the contaminants in the box by a gas flow (natural circulation) using heat generated in the device.

At first, a configuration of the cleaning device using the photo-electron will be described.

The cleaning device using a photo-electron comprises a photo-electron emitting material, a ultraviolet lamp, an electrode for an electric field for emitting a photo-electron and a charged particle collecting member, and removes the particles (particulate materials).

The photo-electron emitting material may be of any type so far as it emits a photo-electron under an irradiation of the ultraviolet ray and preferably it has a smaller photoelectric work function. From a viewpoint of effectiveness and economical efficiency, either of Ba, Sr, Ca, Y, Gd, La, Ce, Nd, Th, Pr, Be, Zr, Fe, Ni, Zn, Cu, Ag, Pt, Cd, Pb, Al, C, Mg, Au, In, Bi, Nb, Si, Ti, Ta, U, B, Eu, Sn P, W, or a compound, an alloy or a mixture thereof is preferable, and each of them may be used alone or as a composite material including two or more kinds thereof. As for the composite material, a physical composite such as an amalgam may be used.

As for a compound, for example, an oxide, a boride or a carbide may be referred to, wherein the oxide includes $BaO$, $SrO$, $CaO$, $Y_2O_5$, $Gd_2O_3$, $Nd_2O_3$, $ThO_2$, $ZrO_2$, $Fe_2O_3$, $ZnO$, $CuO$, $Ag_2O$, $La_2O_3$, $PtO$, $PbO$, $Al_2O_3$, $MgO$, $In_2O_3$, $BiO$, $NbO$, $BeO$ or the like, and the boride includes $YB_6$, $GdB_6$, $LaB_5$, $NdB_6$, $CeB_6$, $EuB_6$, $PrB_6$, $ZrB_2$ or the like and also the carbide includes $UC$, $ZrC$, $TaC$, $TiC$, $NbC$, $WC$ or the like.

As for the alloy, brass, bronze, phosphor bronze, alloy of Ag and Mg (including 2–20 wt. % of Mg), alloy of Cu and Be (including 1–10 wt. % of Be) and alloy of Ba and Al may be used and the alloy of Ag and Mg, that of Cu and Be, and that of Ba and Al described above are preferable. The oxides may be produced by heating only a metal surface in air or also by chemical oxidization.

Alternatively the metal may be heated prior to use to form on a surface thereof an oxide layer which is stable for a long period. For example, placing the alloy of Mg and Ag in the vapor atmosphere under a temperature range of 300 to 400° C. forms an oxide film on a surface thereof, which is stable for a long period.

Further, a material emitting the photo-electron may be used by adding it to another material. An example in which a material capable of emitting a photo-electron is added to an ultraviolet ray transmitting material is disclosed by Japanese Patent Publication No. Hei 7-93098 and Japanese Patent Laid-open Publication No. Hei 4-243540.

As for integration of a photo-electron emitting material with an ultraviolet ray source, which will be described later, an example in which the photo-electron emitting material is added to a surface of the ultraviolet lamp is disclosed by Japanese Patent Laid-open Publication No. Hei 4-243540. Compactness realized by such integration is advantageous in some types of boxes.

The shape and structure of the photo-electron emitting material can be, as described later, appropriately determined depending on the shape, structure or expected effect of the device (unit).

An irradiation source for emitting a photo-electron from the photo-electron emitting material may be of any type so far as the photo-electron can be emitted by irradiation, and typically an ultraviolet ray source is preferable.

As for the kinds of ultraviolet, any kind may be employed so far as the photo-electron emitting material emits a photo-electron by irradiation thereof.

The ultraviolet ray source may be of any type so far as the ultraviolet ray is emitted, with a mercury arc lamp such as a bactericidal lamp being preferable because of its compactness.

Next, will be described an arrangement and shape of an ultraviolet ray source, the photo-electron emitting material, the electrode and a charged particle collecting member, which is one of the features of the present invention. They are characterized in that the last three members are disposed, together with the photo-catalyst described later if necessary according to the required performance, surrounding the ultraviolet ray source so that they are integrated into a cleaning device (unit) for cleaning gases including the harmful gases and particles.

The arrangement and shape of the photo-electron emitting material may be of any type so far as it can be disposed so as to surround the ultraviolet rays emitted from the ultraviolet ray source (so as to make the irradiation area wider). Usually, since the ultraviolet rays from the ultraviolet ray source are emitted radially, it is preferably disposed in a circular manner surrounding the ultraviolet ray source.

The photo-electron can be efficiently emitted from the photo-electron emitting material by the ultraviolet ray irradiation under an electric field. Accordingly, the arrangement and shape of the electrode may be of any type so far as an electric field may be formed between the electrode and the photo-electron emitting material. The material of the electrode and the structure thereof may be those used in a well-known charging device. The material of the electrode may be any conductive material, for example, a wire, a rod, a net or a sheet of tungsten, SUS or Cu-Zn. One of them is, or two or more in combination are disposed so that the electric field can be formed in the vicinity of the photo-electron emitting material (Japanese Patent Laid-open Publication No. Hei 2-303557).

As for the collecting member of the charged particles (dedusting member), various types of electrode or electrostatic filter such as a dedusting plate or a dedusting electrode of a conventional charging device are generally used and also a wool-type electrode such as a steel-wool electrode or tungsten-wool electrode may be useful. An electret material may be preferably used.

The electrode material for emitting the photo-electron may serve simultaneously as the dedusting material (Japanese Patent Publication No. Hei 8-211).

A preferable combination of the photo-electron emitting material, the electrode material and the charged particle collecting member may be determined appropriately based on the shape, structure, and required performance or economic efficiency of the box, and it may be of any combination so far as contaminants such as particles existing in a cleaning space described later can be rapidly moved into the cleaning device by installing the device in the cleaning space.

The arrangement and the shape of the photo-electron emitting material and the electrode can be determined by means of a preliminary test or the like taking the shape, effect, or economic efficiency of the box into account so that they surround the ultraviolet ray source, that the ultraviolet ray source, the photo-electron emitting material, the electrode and the charged particle collecting member may be integrated into a unit, that ultra-violet rays emitted from the ultraviolet ray source may be used efficiently, and that the emission of the photo-electrons and the charging and collecting of the particles by the photo-electrons may be performed efficiently. For example, since the ultraviolet rays are emitted radially when a rod (cylinder) shaped ultraviolet lamp is used, the more the ultraviolet rays directed radially are irradiated onto the photo-electron emitting material, the greater the number of photo-electrons are emitted.

Next, the cleaning device using the photo-catalyst will be described.

The photo-catalyst serves to remove gaseous harmful components, and it may be of any material so far as it is excited by the light irradiation emitted from the light source and decomposes an organic gas (non-methane hydro-carbon, H.C.) causing an increase in the contact angle into other types of gas which do not cause an increase in the contact angle, or which changes it to have a stable constitution which has no effect even if it attaches to a surface of a material.

Generally, a semiconductor material is preferable because of its effectiveness, easy availability and good workability. From a viewpoint of effectiveness and economic efficiency, any of Se, Ge, Si, Ti, Zn, Cu, Al, Sn, Ga, In, P, As, Sb, C, Cd, S, Te, Ni, Fe, Co, Ag, Mo, Sr, W, Cr, Ba, Pb or a compound, an alloy or an oxide thereof is usable, and they may be used alone or in the form of a composite material comprising two or more kinds thereof.

For example, as an element, Si, Ge or Se is preferable, as the compound, AlP, AlAs, GaP, AlSb, GaAs, InP, GaSb, InAs, InSb, CdS, CdSe, ZnS, $MoS_2$, $WTe_2$, $Cr_2Te_3$, MoTe, $Cu_2S$, or $WS_2$ is preferable and also as the oxide, $TiO_2$, $Bi_2O_3$, CuO, $Cu_2O$, ZnO, $MoO_3$, $InO_3$, $Ag_2O$, PbO, $SrTiO_3$, $BaTiO_3$, $Co_3O_4$, $Fe_2O_3$ or NiO is preferable.

Depending on the type of object to which these materials are applied, the metal material may be burned to form a photo-catalyst on a surface thereof. For example, Ti material may be burned to form thereon $TiO_2$, which serves as a photo-catalyst.

The photo-catalyst of the present invention is characterized in that it is disposed to surround the light source, in the same manner as the photo-electron emitting material and is integrated into the gas cleaning device (unit). It is one of the features of the present invention that the photo-catalyst can be integrated into the cleaning device which uses the photo-electron described above depending on the required performance.

That is, the arrangement of the photo-catalyst in the gas cleaning device may be such that (1) the photo-catalyst is directly attached to the ultraviolet lamp, (2) the ultraviolet ray source is surrounded by a glass or a vitreous material and the photo-catalyst is attached to a surface of the glass or the vitreous material, (3) the photo-catalyst is attached on a wall disposed circular in a facing the ultraviolet ray source, or (4)

the photo-catalyst is fixed within the device to an appropriate material, which material can be sheet-shaped, floccus-shaped, net-shaped, honeycomb-shaped, filmy, on a cylindrical or fibrous material formed by coating, wrapping or sandwiching. For example, coating of titanium dioxide onto a glass plate by a sol-gel method may be employed. The photo-catalyst may be used in a powdery form without processing and may also be used in proper shapes formed by a well-known method such as sintering, deposition, spattering, application or bake finishing.

The options described above may be selected appropriately depending on the shape of the box, the kind and shape of the light source, the kind of photo-catalyst, the expected effect, economic efficiency and the like. In order to improve the efficiency of a photo-catalyst, a material such as Pt, Ag, Pd, $RuO_2$, or $Co_3O_4$ may be added to the photo-catalyst described above. The addition of these materials is preferable since increased efficiency in operation of the photo-catalyst results. Each may be used alone or as a composite material comprising two or more kinds thereof.

As for the methods of addition, there may be employed well-known methods including impregnation, photo-reduction, spattering deposition, or a kneading method.

As for the light source for emitting the light, any light source may be employed so far as it emit light having a wavelength which can be absorbed by the photo-catalyst, and a visible and/or ultraviolet light being useful, so that well-known light sources may be used appropriately. For example, a mercury arc lamp, a bactericidal lamp, a black light, a fluorescent chemical light or an UV-B ultraviolet lamp may be used.

The light source of visible light may be used only when a gaseous harmful material is required to be removed as a contaminant, and also an ultraviolet lamp such as a bactericidal lamp is effective.

A bactericidal lamp is preferable since it augments an effective quantity of irradiation (which is absorbed by the photo-catalyst to activate the operation thereof) and accelerates the photo-catalyst operation.

Though the mechanism for removing gaseous harmful components by a photo-catalyst, particularly the mechanism of removal of organic gases which cause an increase in contact angle depends on the kinds and properties of a subject material (for example, a wafer or glass material) and a film formed thereon, in accordance with the investigation of the inventors of the present invention, such a mechanism described as below.

Namely, a factor common to organic gases (H.C.) which increase the contact angle on the surface of a subject material in a clean room is that a substantial part thereof is high molecular hydro-carbon (H.C.) having —CO or —COO bonding (with hydrophilic property) in its chemical constitution. This H.C. may be considered to be a hydrophobic material (—C—C—portion as a basic structure of H.C.) having a hydrophilic part (—CO, —COO bonding portion).

In concrete terms, organic gases which increase the contact angle on the surface of a subject material such as a glass substrate in a conventional clean room is a high molecular H.C. of $C_{16}$ to $C_{20}$ such as ester phthalate or a derivative of higher fatty acid phenol, and what is common to these components is that they have —CO or —COO bonding (with hydrophilic property) in their chemical constitutions ("Air Cleaning" Vol. 33, No. 1, pp. 16–21, 1995).

These contaminative organic gases are released from plasticizers, molds releasing agents, antioxidants and the like of high molecular products, that is, high molecular portions of such products generate these gases ("Air Cleaning" Vol. 33, No. 1, pp. 16–21, 1995).

Though a mechanism of processing of these organic gases by a photo-catalyst is not clear in detail, it can be surmised as follows. That is, these organic gases make a hydrogen bonding at —CO or —COO bonding portion thereof with OH-group on the surface of the wafer or the glass to make a hydrophobic surface thereon and as a result the surface of the wafer or the glass becomes hydrophobic to increase the contact angle and accordingly the film formed thereon has weak adhesive strength.

That is, when a photo-catalyst is placed in an atmosphere where an organic gas exists, since the photo-catalyst is adsorptive, H.C. is adsorbed at a —CO or —COO bonding portion thereof by the photo-catalyst on a surface thereof and is transformed into other stable states by catalytic action. It is surmised that, as a result, the organic gas is converted into a stable state (transformed into low molecular materials) and thereby is unable to attach to a wafer or glass substrate or, if it does attach thereto, does not result in a hydrophobic.

A photo-catalyst is useful for removing basic gases (gaseous harmful components) such as ammonium or amine as well as for decomposing or removing H.C. described above.

It is one of the features of the present invention that a photo-electron or photo-catalyst may be used alone for gas cleaning in a box depending on the performance required, economic efficiency and the like.

That is, the cleaning device utilizing a photo-electron may be employed when only particles (particulate materials) are problematic, while a cleaning device utilizing a photo-catalyst may be employed when only the gaseous harmful components such as $NH_3$ or amine are problematic.

According to the present invention, even if dust or gas is generated within a box, it can be removed by the cleaning device (unit) installed therein. That is, the box has a self-cleaning function.

The box of the present invention incorporates a unit-type gas cleaning device which utilizes a photo-electron or photo-catalyst and can be easily attached or detached, and is cleaned by the cleaning device when the device is connected to and actuated by a power supply device, or by another type of gas cleaning unit which is formed by integrating said cleaning device with a rechargeable battery-type electric power source and is attached to the box, which is one of the features of the present invention.

The connection between the gas cleaning device of the present invention and the power supply device is illustrated in a schematic block diagram of FIG. 6, and will now be described.

A box 10 (which corresponds to a box 21 described later) of the present invention is provided with a gas cleaning device A-2 which utilizes a photo-electron or photo-catalyst. The box 10 is integrated with a gas cleaning device A-2 into a single unit. The box of the present invention is used to transport (carry) a substrate, and since, in practical use, there is a rather high incidence of halting periods in a load port, stand-by station and stocker, the gas cleanings device A-2 is supplied with electricity from an electric power source 13 in an electric power supply device 14 installed in the load port, stand-by station or stocker an interval of the transportation whereby a gas cleaning operation in the box 10 is performed.

That is, an inside of the box 10 including the gas cleaning device A-2 incorporated thereinto is cleaned by being supplied with electricity as described above from the power supply device 14 installed, for example, in the load port, stand-by station, stocker of a semiconductor processing device during an interval of the transportation.

Accordingly, since, in the box, the gas is cleaned using an photo-electron or photo-catalyst during a stand-by period of the box (during general stand-by period or during night), a super clean space is created in the box with the substrate received therein.

An integration of the gas cleaning device of the present invention and the electric power source device is shown in the schematic block diagram of FIG. 7, and will be described with reference thereto.

The box 10 of the present invention is provided with a rechargeable battery type electric power source device A-1 and the gas cleaning device A-2 which uses the photo-electron or the photo-catalyst. The electric power source device A-1 and the gas cleaning device A-2 are integrated into one unit (gas cleaning unit A).

That is, the electric power source device A-1 comprises a charging circuit 11, a battery 12 and an electric power source 13 for supplying the gas cleaning device A-2 with electricity, and is properly supplied with electricity by a power supply device (power supply station) 14 to charge the battery 12 through the charging circuit 11. The box of the present invention is used for transportation (as a carrier), and the gas cleaning device A-2 is continuously driven during transportation by being supplied with electricity charged in the battery 12 of the electric power source device A-1 through the electric power source 13. The battery 12 may be of any type so far as it can be charged and properly supply electricity, for example, it may be Li-ion battery or Ni-hydrogen battery.

In the box 10 of the present invention including the gas cleaning unit A incorporated thereinto, as described above, the battery 12 is supplied with electricity by a power supply device 14 installed, for example, in the load port, the stand-by station or the stocker of the semiconductor processing device during an interval of the in transportation.

Thereby, since, in the box, the gas is cleaned using a photo-electron or photo-catalyst during transportation or a stand-by period of the box or continuously, a super clean space can be maintained in the box.

Then the use of the heat generated in the electric power source device A-1, which is one of the features of the present invention, will be described.

The electric power source device A-1 includes electronic components of high heat generation (e.g. power transistor, power EFT) and other electronic components with low heat generation, and, in the present invention, the heat from the electronic components with high heat generation is transmitted to the gas cleaning device A-2 to promote a gas flow. This will be described with reference to FIGS. 8(*a*) and 8(*b*).

Figure 8:
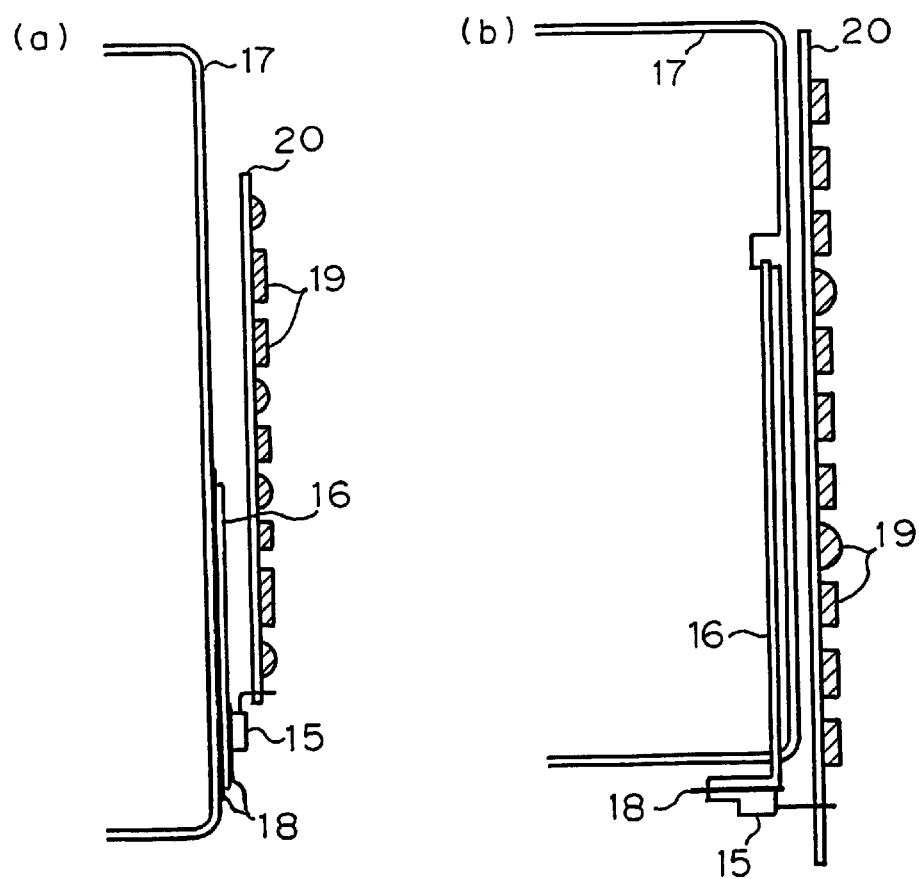
FIGS. 8(a) and 8(b) are explanatory drawings illustrating how to use heat generated in the electric power source device.

At first, FIG. 8(*a*) will be described. FIG. 8(*a*) shows an electronic component disposed in the electric power source device A-1 and a wall of the gas cleaning device A-2 located adjacent to the electric power source device A-1.

The heat generated in the electronic component 15 during operation thereof is transmitted through a radiation board 16 to a wall 17 of the gas cleaning device A-2 (which corresponds to a cleaning space section B side of a sheet type electrode 30 or a shading member 35). Reference numeral 18 designates a heat conductive sheet for transmitting the heat efficiently. A heat conductive grease or an epoxy resin adhesive may be used in place of the heat conductive sheet 18.

The radiation board 16 may be of any material so far as it transmits heat efficiently, for example, it may be Cu or Al. Generally, Al is preferable because of its light weight and relatively low price.

Reference numeral 19 designates an electronic component with low heat generation disposed on a printed circuit board 20.

Thus, the heat generated in the electronic component 15 with high heat generation is transmitted to the wall of the gas cleaning device A-2. Since gas circulation in the device A-2 is accelerated by using heat generation efficiently, gas in the box can be cleaned effectively.

Though gas cleaning of the present invention is performed essentially slowly since it relies on a gas flow generated by heat generation from a light source such as an ultraviolet ray source, a more effective means is to use heat generation in the electronic component described above to accelerate the gas flow.

Then FIG. 8(*b*) will be described.

In FIG. 8(*b*), the radiation board 16 is directly disposed within the gas cleaning device passing through the wall 17.

In FIG. 8(*b*), the same reference numerals with those of FIG. 8(*a*) designate the same elements.

The present invention can be used not only in the air of a conventional clean room but also in, for example, a $N_2$ or Ar atmosphere.

Since the present box provides a clean space continuously by means of the power supply, it can be used not only for the transportation but also as a stock box (stocker), which is one of the features of the present invention.

Depending on the kinds of the box or the required performance, a heating source such as heater or lamp may be additionally installed in the box in order to accelerate the gas flow therein. Since the installation of the heating source accelerates the removal of contaminants, it may be employed appropriately.

The gas cleaning device or the gas cleaning unit of the present invention may be incorporated into the box by a well-known connecting method, for example, by placing a non-outgassing packing material therebetween, or by a magnet (magnetic force).

EMBODIMENTS

There will now be shown some embodiments for the purpose of illustration, and therefore the invention should not be limited by the specific embodiments described.
Reference No. 1

A wafer carrier box 21 in a semiconductor plant will be described with reference to FIG. 1.

FIG. 1 shows a side opening integral type carrier box.

In the semiconductor plant, high quality products are manufactured in a class 1,000 clean room. Since a wafer 22 is processed (e.g. film forming) into a high quality (micro-structured, precise) product, the gaseous material or fine particulate material (particles) has an effect thereon.

That is, as the gaseous harmful components in the class 1,000 clean room, there exists 1.1 to 1.5 ppm of non-methane hydro-carbon generated by an outgassing of structural members of the clean room and instruments therein adding to H.C. introduced from the outside air. On the other hand, since a workman also generates the contaminants (gaseous material, particles), there is a dirty atmosphere surrounding the wafer 22 near the workman.

Accordingly, the wafer 22 is received in the wafer carrier box 21 and is transported to each process (e.g. film forming process) to be processed into a high quality product.

An opening and closing mechanism of the box 21 comprises a box door 23, a wafer retainer 24 and a sealing member 25 and they are integrated into one unit, and the box door 23 is released from a box main body 21 by engaging the box door 23 with a door opener (not shown, SEMI standard) and horizontally drawing it out of the box main body and then pulling it downward.

The box 21 is held by a transportation robot for the clean room at a robot flange 26 and is mounted on the load port of the semiconductor processing device, and, after the box door 23 having been opened, the wafer 22 is loaded or unloaded one by one by a scalar robot for the clean room. After the box door 23 having been closed, the box 21 is transported to the next processing device again by the transportation robot for the clean room.

In the box 21, there is installed the gas cleaning device A-2 comprising a ultraviolet lamp 27, a photo-catalyst 28, a photo-electron emitting material 29, an electrode 30 (grid-shaped or net-shaped) for emitting a photo-electron from the photo-electron emitting plate, and a charged particle collecting member 31.

Figure 6:
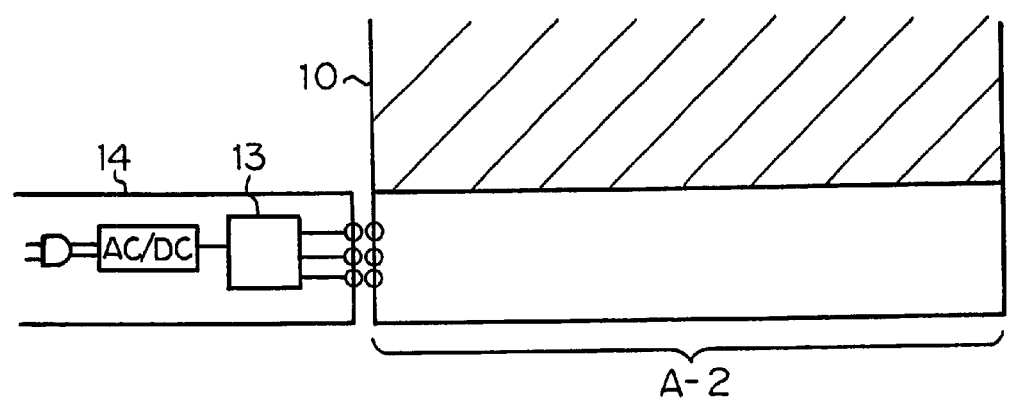
FIG. 6 is a block diagram illustrating a gas cleaning unit and an electric power supply device connected thereto according to the present invention.

As for the power supply from the electric power source to actuate the gas cleaning device A-2, electricity is supplied by an external power supply device as shown in FIG. 6, and the air in the box 21 is cleaned by the cleaning device A-2.

Since the device A-2 is supplied with electricity by the power supply device installed in the load port or the stocker, the cleaning operation can be performed for a long period (clean space can be maintained).

That is, in the box 21, there exist hydro-carbon (H.C.) as the gaseous harmful component which attaches to the wafer 22 to increase the contact angle thereof and particles which attach to the wafer to cause a possible breakage or short-circuit and thereby lower the yield thereof. These contaminants enter from the clean room into the box 21 every time the box door 23 is opened in order to take the wafer 22 in or out the box 21.

According to the present invention, the H.C. is decomposed by a photo-catalytic action of the photo-catalyst 28 on which the ultraviolet rays are irradiated from the ultraviolet lamp 27 to be transformed into a configuration which does not increase the contact angle. The particles (particulate materials) are charged by a photo-electron 33 emitted from the photo-electron emitting material 29 irradiated by the ultraviolet lamp 27 to form charged particles, and then the charged particles are collected by the electrode 31 as the charged particle collecting member, so that a cleaning space section B in which the wafer 22 exists is made a super clean space. A movement of H.C. and the particles within the box into a gas cleaning device A-2 depends on an airflow (34-1 to 34-6 in FIG. 1) caused by a small temperature difference between an upper and a lower portions in the gas cleaning device A-2 generated by the irradiation from the ultraviolet lamp 27 in the device A-2.

The box is made of P.C., the ultraviolet lamp is a bactericidal lamp (254 nm), the photo-catalyst is made of AL with an additive of $TiO_2$, the photo-electron emitting material is made of Al with an additive of Au, the electrode for emitting the photo-electron is made of net-shaped SUS (10 V/cm) and the charged particle collecting member is made of SUS (500 V/cm).

Reference numeral 35 in FIG. 1 designates a shading member for intercepting the irradiation of the ultraviolet rays from the ultraviolet lamp 27 to the wafer 21. The reference numeral 36 designates a partition board for effectively guiding the airflow 34-1 to 34-6 caused by the irradiation of the ultraviolet rays to the vicinity of the wafer.

Thus, the harmful gases and particles in the air within the box 21 are processed and a super clean space cleaner than class 1, is created and maintained in the box 21 whereby the contact angle on the wafer received therein does not increase. Since the contact angle on the substrate such as wafer does not increase, the film is formed on this substrate to be of sufficient adhesive strength (for example, H.C. concentration of 0.1 ppm or lower and $NH_3$ concentration of 1 ppb or lower could be accomplished).

The gas cleaning device A-2 can be separated from the cleaning space section B of the box containing the wafer received therein, which are connected to each other by placing the packing material therebetween.

The separation is implemented in a periodical maintenance timing, for example, once a year.

This facilitates the maintenance and control service of a vessel of the cleaning space section (B) in the box where the wafer is received and the gas cleaning device (A-2).

Reference numeral 37 designates a kinematic coupling having a V-groove formed thereon for positioning the box.

Embodiment No. 1

Figure 2:
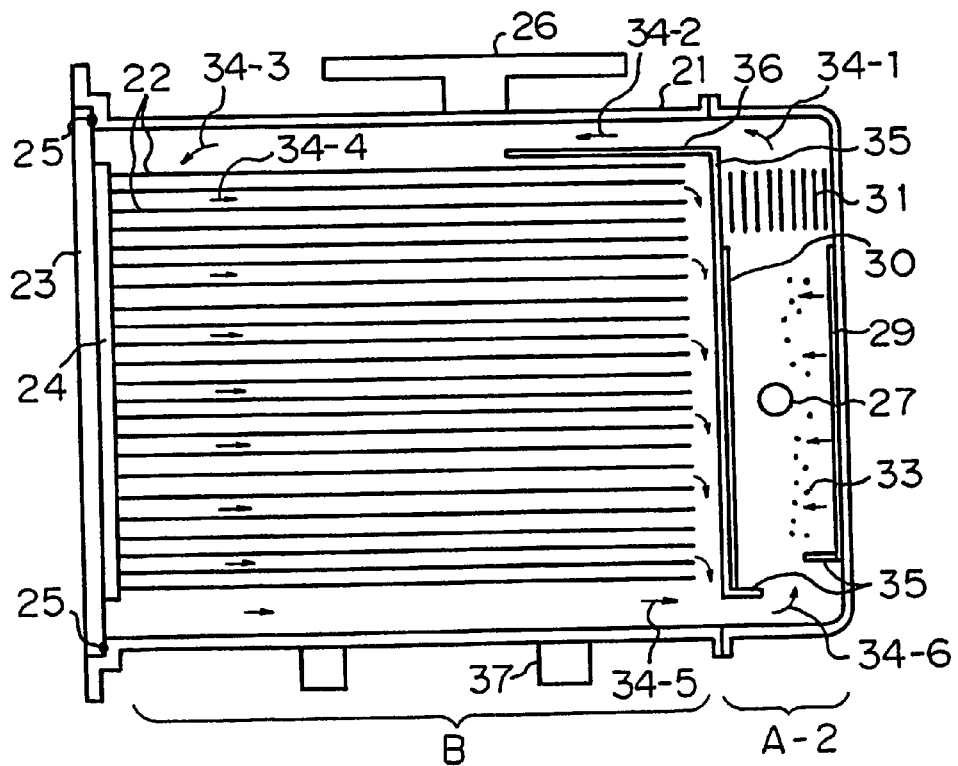
FIG. 2 is a cross sectional view illustrating an example of a side opening integral type carrier box according to the present invention.

A wafer carrier box in the semiconductor plant is shown in FIG. 2.

Since, in the wafer of the present plant, an effect of the gaseous material need not be taken into account, only the removal operation of the particles is conducted.

In the box 21 in FIG. 2 is installed the gas cleaning device A-2 which comprises the ultraviolet lamp 27, the photo-electron emitting material 29, the electrode 30 (of sheet type) for emitting a photo-electron from the photo-electron emitting material 29 and the charged particle collecting member 31.

The air cleaning in the box 21 is conducted, as shown in FIG. 6, by a power supply to the gas cleaning device A-2 from the power supply device installed in the load port or the stocker.

That is, there are particles in the box 21, which attach to the wafer 22 to cause a possible breakage or short-circuit and thereby lower the yield thereof. These particles enter from the clean room (class 1,000) into the box 21 every time the box door 23 is opened in order to take the wafer 22 in or out the box 21.

The particles are charged by the photo-electron 33 emitted from the photo-electron emitting material 29 on which the ultraviolet rays are irradiated from the ultraviolet lamp 27, to be changed into charged particles, and then the charged particles are collected by the charged particle collecting member 31, so that a cleaning space section B in which the wafer 22 exists is made a super clean space.

Since the gas cleaning device A-2 is supplied with electricity by the power supply device as described above, the cleaning operation (air cleaning) thereby can be performed for long time period.

Thus, a super clean space, cleaner than class 1 can be maintained in the box 21.

In FIG. 2, the same reference numerals as those of FIG. 1 designate the same elements.

Embodiment No. 2

Figure 3:
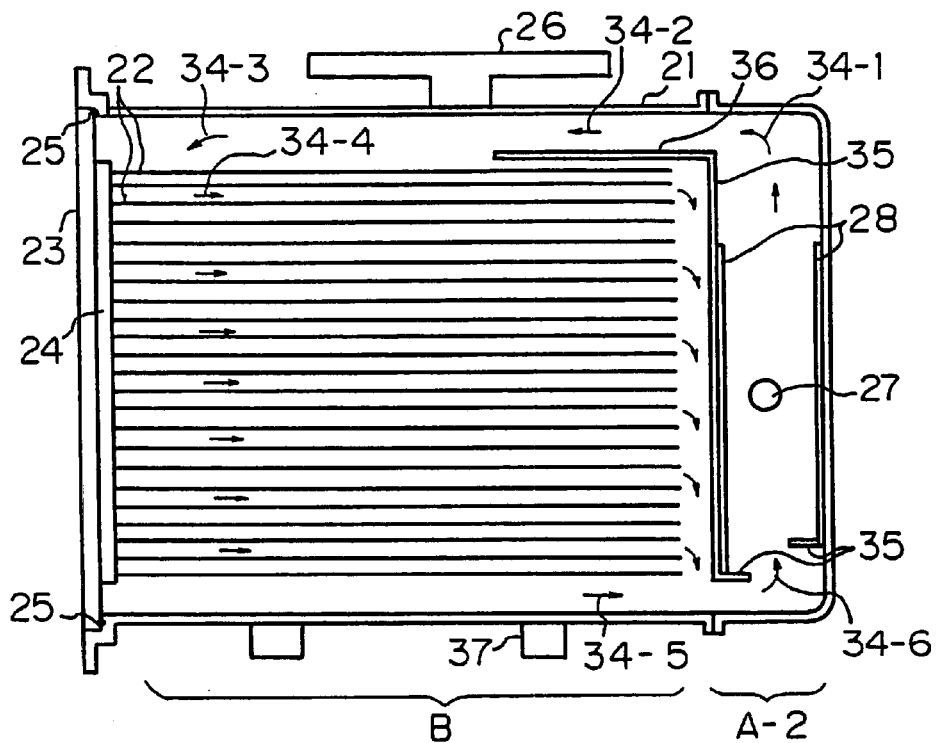
FIG. 3 is a cross sectional view illustrating another example of a side opening integral type carrier box according to the present invention.

A wafer carrier box in the semiconductor plant is shown in FIG. 3.

Since, in this plant, the carrier box is used in a clean space cleaner than class 10 and thereby an effect of the particles need not be taken into account, only the removal operation of the gaseous harmful components is conducted.

The gas cleaning device A-2 in the box 21 of FIG. 3 comprises the ultraviolet lamp 27 and the photo-catalyst 28.

The air cleaning in the box 21 is conducted, as shown in FIG. 6, by a power supply to the gas cleaning device A-2 from the power supply device installed in the load port or the stocker.

That is, there is H.C. or NH$_3$ as gaseous harmful components (harmful gases) in the box 21, which attach to the wafer 22 to increase the contact angle of the wafer.

These harmful gases enter from the clean room into the box 21 every time when the box door 23 is opened in order to take the wafer 22 in or out the box 21. In addition, depending on the kind of the wafer, there may be an outgassing from the surface of the wafer (the harmful gas may be generated).

These harmful gases are decomposed by the photo-catalytic action of the photo-catalyst 28 on which the ultraviolet rays are irradiated from the ultraviolet lamp 27 to be transformed into forms which do not increase the contact angle, so that the cleaning space section B in which the wafer 22 exists is made a super clean space.

Since the gas cleaning device A-2 is supplied with electricity by the power supply device as described above, a cleaning operation (air cleaning) conducted thereby can be performed for long period. Even if a harmful gas is generated from the surface of the wafer 22, the space in the box 21 can be cleaned in a self-cleaning manner.

Thus, harmful gases in the air within the box 21 are processed and the air in the box 21 is made clean, including little harmful gas, whereby the contact angle on a substrate such as wafer received therein does not increase. (For example, H.C. concentration of 0.1 ppm or lower and NH$_3$ concentration of 1 ppb or lower could be accomplished).

In FIG. 3, the same reference numerals as those of FIG. 1 denote the same elements.

Reference No. 2

Figure 4:
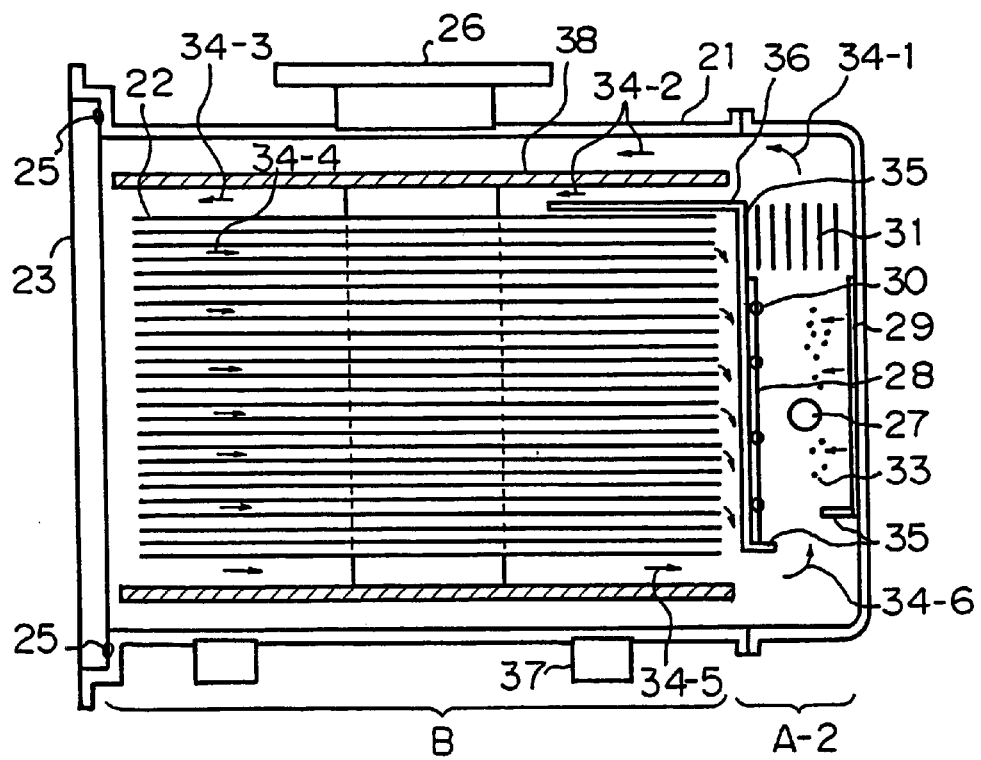
FIG. 4 is a cross sectional view illustrating an example of an open cassette container type side opening carrier box of Reference No. 2.

Another type of wafer carrier box 21 different to that of Reference No. 1 shown in FIG. 1 is shown in FIG. 4. FIG. 4 shows an open cassette container type side opening carrier box in which an open cassette 38 containing the wafer 22 is housed in the box of FIG. 1. In an opening and closing mechanism of this box, there is no wafer retainer (reference numeral 24 in FIG. 1) since the wafer 22 is held in the open cassette 38. In FIG. 4, the same reference numerals as those of FIG. 1 represent the same elements.

Reference No. 3

Figure 5:
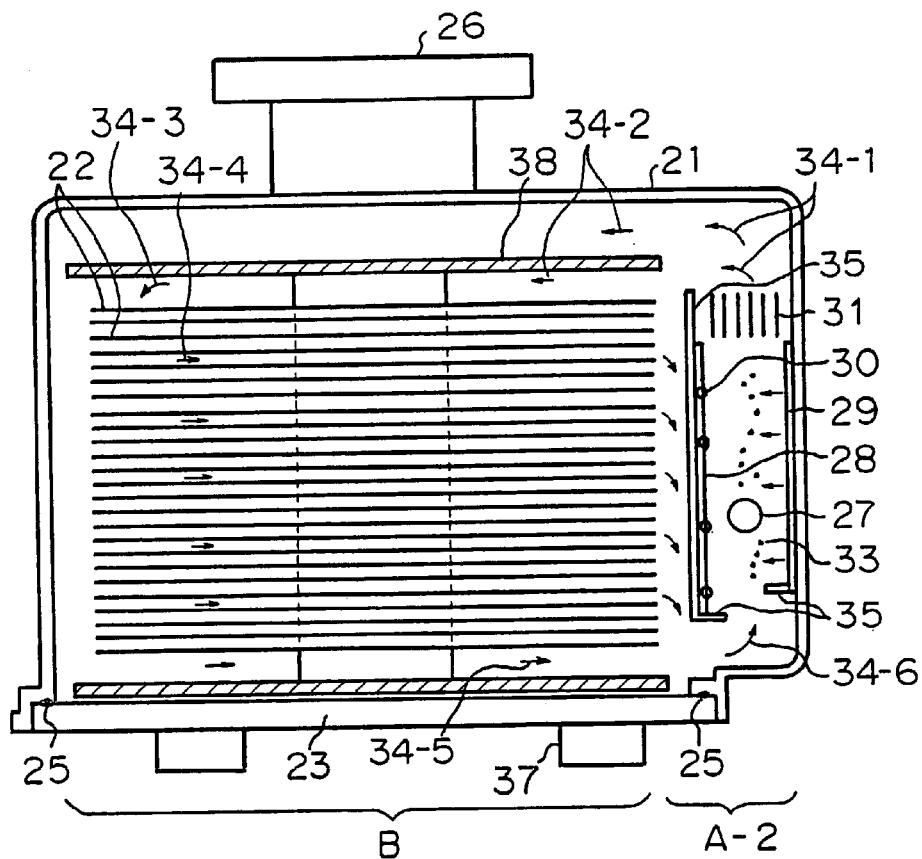
FIG. 5 is a cross sectional view illustrating an example of an open cassette container type bottom opening carrier box of Reference No. 3.

Another type of wafer carrier box 21 than that of Reference No. 1 shown in FIG. 1 is shown in FIG. 5. FIG. 5 shows an open cassette container type bottom opening carrier box in which the box 21 has at a bottom thereof an opening and closing mechanism comprising a box door 23 and a sealing member 25.

That is, this box 21 is of a bottom opening type, and the opening and closing mechanism of the box 21 comprising the box door 23 and the sealing member 25 is operated by engaging an opener having elevator mechanism (not shown) with the box door 23 and lowering them vertically downward under a condition where the box is lifted up, and thereby the box door 23 is opened.

An inside of the box 21 is used to receive the open cassette 38 containing the wafer 22.

In FIG. 5, the same reference numerals as those of FIG. 1 represent the same elements.

Embodiment No. 3

The wafer carrier box incorporated therein with the cleaning device for removing the harmful gas or the particles shown in FIG. 2 or 3 was placed in a class 1,000 semiconductor plant and, after a sample gas shown below was introduced into the box and the ultraviolet rays were irradiated, the contact angle on the wafer received in the wafer carrier box and the concentrations of the particles and non-methane hydro-carbon in the box were measured.

The electric power source device is supplied with electricity by being connected to the power supply device of the stocker in the clean room.

1) Size of the carrier box: 35 liters, made of P.C.
2) Cleaning device
   (1) Ultraviolet ray source: Bactericidal light 4W
   (2) Photo-catalyst material: Al sheet with TiO$_2$ added thereon by sol-gel method
   (3) Photo-electron emitting material: Al sheet with Au added thereon
   (4) Electrode for emitting photo-electron: grid-shaped SUS, 20V/cm
   (5) Charged particle collecting member (electrode sheet): SUS sheet, 800V/cm
3) Sample gas (inlet)
   Medium gas: air
   Particle concentration: class 1,000
   Non-methane hydro-carbon concentration: 1.5 ppm
4) Wafer: 12 inches×13 sheets
5) Measuring instrument
   Contact angle: waterdrop type contact angle measuring instrument
   Particle concentration: particle counter by light scattering method (>0.1 $\mu$m)
   Non-methane hydro-carbon concentration: gas chromatograph Where, the particle concentration (class) indicates a total number of particles with a diameter more than 0.1 $\mu$m included in 1 ft$^3$.

TEST RESULT (1) Contact Angle on the Wafer

Figure 15:
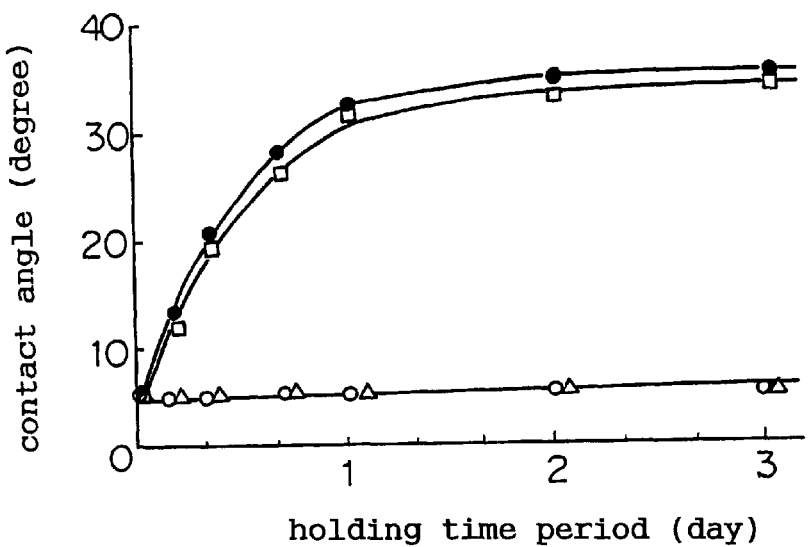
FIG. 15 is a diagram illustrating a variation of a contact angle (degree) as a function of holding period (day)

The contact angle on the wafer received in the box is shown as a function of holding period in FIG. 15. In FIG. 15, a case where the cleaning is conducted by both of the photo-catalyst and the photo-electron is shown by -○-, another case where the cleaning is conducted only by the photo-catalyst of the present invention is shown by -Δ-, another case where the cleaning is conducted only by the photo-electron is shown by -□-, and the last case where no cleaning is employed is shown by -●-.

(2) Particle Concentration in the Box (Class)

The particle concentrations (classes) in the box after an hour, two hours, one day and a week are shown in Table 1. For comparison, the case where the cleaning is conducted by both of the photo-catalyst and the photo-electron, and another case where no cleaning is employed are shown also in Table 1.

TABLE 1

| | value: class | | | |
|---|---|---|---|---|
| Cleaning condition | After 1 hour | After 2 hours | After 1 day | After 1 week |
| Photo-electron & Photo-catalyst | <1 | <1 | <1 | <1 |
| Photo-catalyst only | 1000 | 900 | * | * |
| Photo-electron of the present invention only | <1 | <1 | <1 | <1 |
| Non-cleaning | 1000 | 900 | * | * |

*: not measured (3) Non-methane Hydro-carbon Concentration in the Box (ppm)

The test was conducted in the same manner as above, and the test result is shown in Table 2.

TABLE 2

| | value: ppm | | | |
|---|---|---|---|---|
| Cleaning condition | After 1 hour | After 2 hours | After 1 day | After 1 week |
| Photo-electron & Photo-catalyst | <0.1 | <0.1 | <0.1 | <0.1 |
| Photo-catalyst of the present invention only | <0.1 | <0.1 | <0.1 | <0.01 |
| Photo-electron only | 1.3 | 1.2 | 1.2 | 1.1 |
| Non-cleaning | 1.4 | 1.4 | 1.4 | 1.3 |

In order to confirm an effect on the wafer resulting from an operation to remove non-methane hydro-carbon in the space, the wafer is received in the box under the condition described above and ester phthalate on the wafer is inspected (DOP: di-2-ethylhexyl phthalate, DBP: di-n-butyl phthalate).

Measuring method: After the wafer was exposed to air under above condition for 16 hours, deposits on the wafer are desorbed and ester phthalate therein is measured by GC/MS method (gas chromatography/mass spectrometry method).

In each case where no photo-catalyst was installed, ester phthalate was detected.

On the contrary, in cases with the photo-catalyst of the present invention installed, no ester phthalate was detected.

Reference No. 4

A wafer carrier box 21 in the semiconductor plant will be described with reference to FIGS. 9 and 10.

Figure 9:
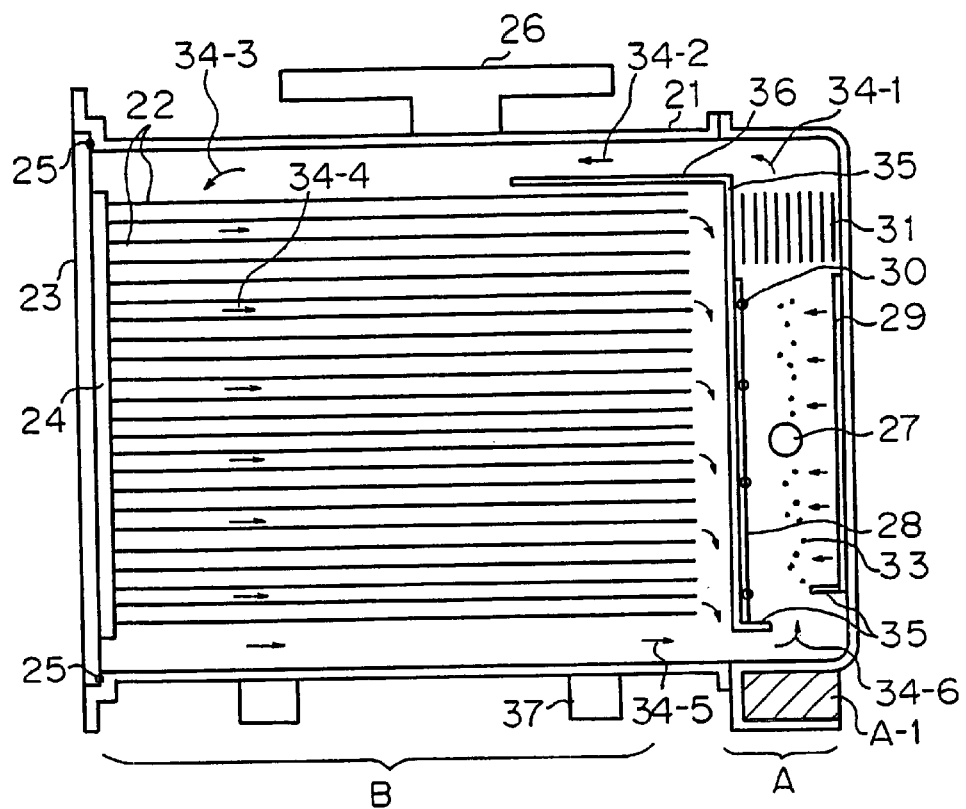
FIG. 9 is a cross sectional view illustrating another example of a side opening integral type carrier box of Reference No. 4.
Figure 10:
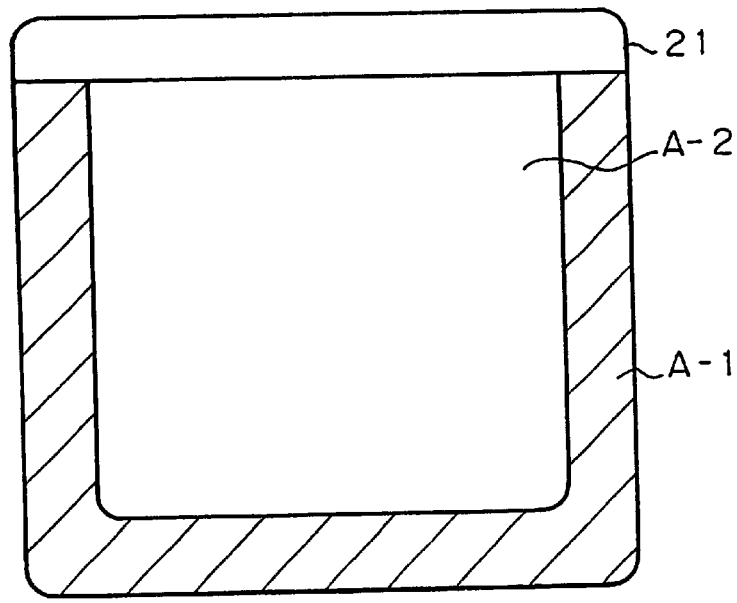
FIG. 10 is a side elevational view of FIG. 9.

FIGS. 9 and 10 show a side opening integral type carrier box, in which FIG. 10 is a right side elevational view of FIG. 9.

In the semiconductor plant, high quality products are manufactured in the class 1,000 clean room. Since a wafer 22 is processed (e.g. film forming) into a high quality (micro-structured, precise) product, the gaseous material or fine particulate material (particles) has an effect thereon.

That is, as the gaseous harmful component in the class 1,000 clean room, there exists 1.1 to 1.5 ppm of non-methane hydro-carbon generated by the outgassing of structural members of the clean room and instruments therein adding to H.C. introduced from outside air. On the other hand, since a workman also generates contaminants (gaseous material, particles), an unclean atmosphere exists around the wafer 22 near the workman.

Accordingly, the wafer 22 is received in the wafer carrier box 21 and is transported to each process (e.g. film forming process) to be processed into a high quality product.

An opening and closing mechanism of the box 21 comprises a box door 23, a wafer retainer 24 and a sealing member 25 and they are integrated into one unit, and the box door 23 is released from a box main body 21 by engaging the box door 23 with a door opener (not shown, SEMI standard) and horizontally drawing it out of the box main body and then pulling it downward.

The box 21 is held by a transportation robot for the clean room at a robot flange 26 and is mounted on the load port of the semiconductor processing device, and, after the box door 23 has been opened, the wafer 22 is loaded or unloaded one by one by a scalar robot for the clean room. After the box door 23 has been closed, the box 21 is transported to the next processing device by the transportation robot for the clean room.

In the box 21, there is installed a gas cleaning unit A (A-1+A-2) comprising a gas cleaning device A-2 including a ultraviolet lamp 27, a photo-catalyst 28, a photo-electron emitting material 29, an electrode 30 for emitting a photo-electron from the photo-electron emitting material and a charged particle collecting member 31, and a rechargeable battery 12 (see FIG. 7) type electric power source device A-1 for supplying the gas cleaning device A-2 with electricity.

Figure 7:
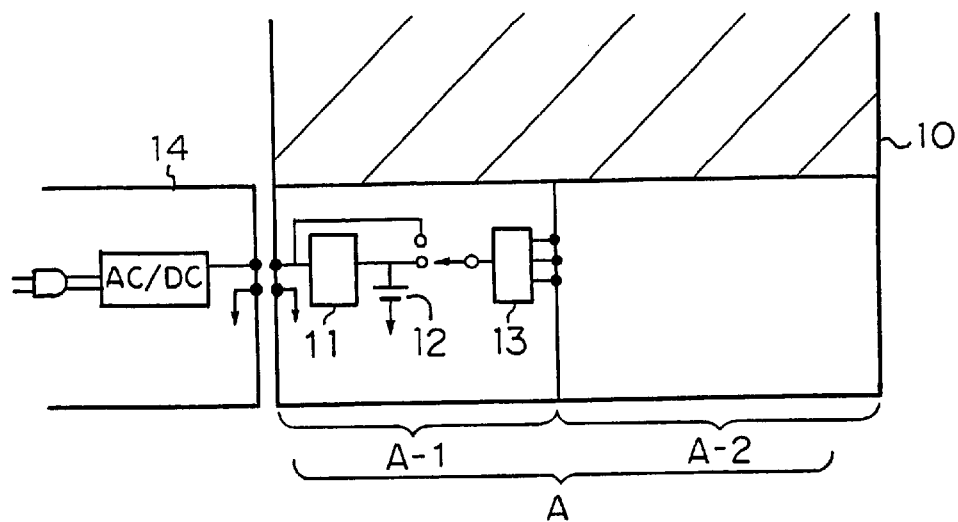
FIG. 7 is a block diagram illustrating a gas cleaning device and an electric power source device integrated thereinto according to the present invention.

The power source device A-1 and the gas cleaning device A-2 of the unit A are configured as shown in FIGS. 7 and 8 described above, and the air in the box 21 is cleaned by the cleaning unit A.

Since the gas cleaning device A-2 is supplied with electricity by the power source device A-1, the cleaning operation (air cleaning) can be performed continuously for long time period.

That is, in the box 21, there exist hydro-carbon (H.C.) as the gaseous harmful component (harmful gas) which attaches to the wafer 22 to increase the contact angle thereof and particles which attach to the wafer to cause a possible fault of breakage or short-cut and thereby to lower the yield thereof. These contaminants enter from the clean room into the box 21 each time the box door 23 is opened in order to take the wafer 22 in or out the box 21.

According to the present invention, the H.C. is decomposed by a photo-catalytic action of the photo-catalyst 28 on which the ultraviolet rays are irradiated from the ultraviolet lamp 27 to be transformed into a form which does not increase the contact angle. The particles (particulate materials) are charged by the photo-electron 33 emitted from the photo-electron emitting material 29 irradiated by the ultraviolet lamp 27 to be changed into charged particles, and then the charged particles are collected by the electrode 31 acting as a charged particle collecting member, so that a cleaning space section B in which the wafer 22 exists is made a super clean space. A movement of H.C. and the particles within the box into gas cleaning device A-2 depends on airflow (34-1 to 34-6 in FIG. 9) caused by a small temperature difference between upper and lower portions in the gas cleaning device A-2 generated by the irradiation from the ultraviolet lamp 27 in the device A-2 and heating of the power source device A-1.

The box is made of P.C., the ultraviolet lamp is a bactericidal lamp (254 nm), the photo-catalist is made of AL with an additive of $TiO_2$, the photo-electron emitting material is made of Al with an additive of Au, the electrode for emitting the photo-electron is made of net-shaped SUS (10 V/cm) and the charged particle collecting member is made of SUS (500 V/cm).

Reference numeral 35 in FIG. 9 designates a shading member for intercepting the irradiation of the ultraviolet rays from the ultraviolet lamp 27 to the wafer 21. The reference numeral 36 designates a partition board for effectively guiding the airflow 34-1 to 34-6 caused by the irradiation of the ultraviolet rays and heating of the power source device toward the vicinity of the wafer.

Thus, the harmful gases and the particles in the air within the box 21 are processed and a super clean space cleaner than class 1 is created and maintained in the box 21 where the contact angle on the wafer received therein does not increase. Since the contact angle on a substrate such as a wafer does not increase, the film is formed on this substrate to be of sufficient adhesive strength (for example, H.C. concentration of 0.1 ppm or lower and $NH_3$ concentration of 1 ppm or lower could be accomplished).

The gas cleaning unit A can be separated from the cleaning space section B of the box containing the wafer received therein, which are connected with each other placing the packing material therebetween.

The separation is implemented in a periodical maintenance timing, for example, once a year.

This facilitates the maintenance and control service of a vessel of the cleaning space section (B) in the box and the gas cleaning unit (A).

Reference numeral 37 designates a kinematic coupling having a V-groove formed thereon for positioning the box.

Embodiment No. 4

Figure 11:
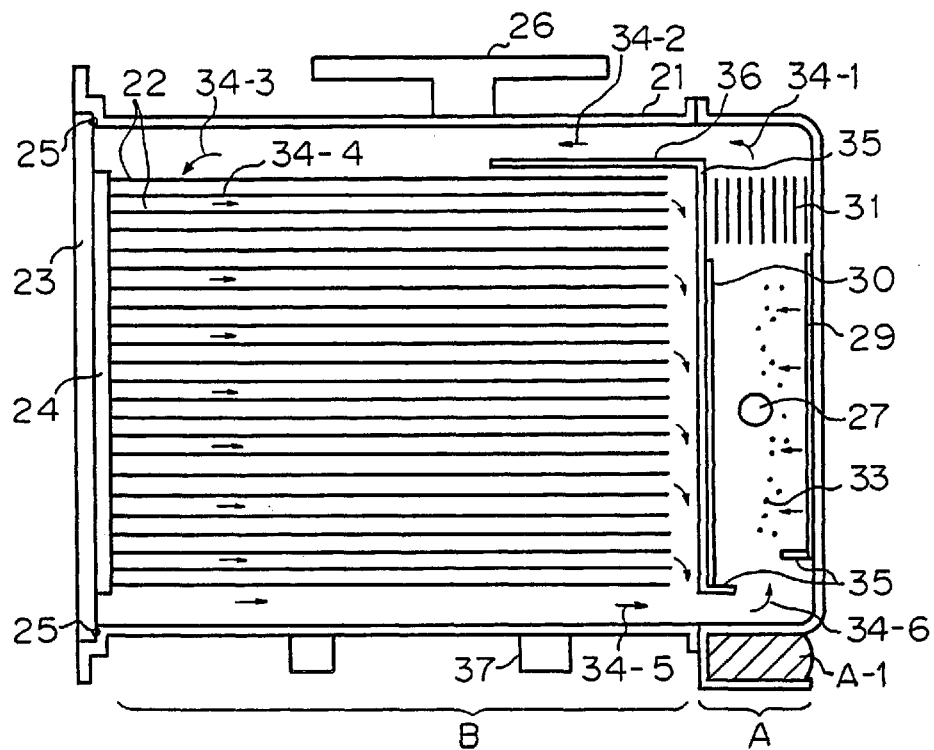
FIG. 11 is a cross sectional view illustrating still another example of a side opening integral type carrier box according to the present invention.

A wafer carrier box in the semiconductor plant is shown in FIG. 11.

Since, in the wafer of the present plant, an effect of the gaseous material need not be taken into account, only the removal operation of the particle is conducted.

The gas cleaning device A-2 in the box 21 of FIG. 11 comprises the ultraviolet lamp 27, the photo-electron emitting material 29, the electrode 30 for emitting the photo-electron from the photo-electron emitting material 29 and the charged particle collecting member 31.

The air cleaning in the box 21 is conducted by the gas cleaning unit A (A-1+A-2) comprising the gas cleaning device A-2 and the rechargeable battery 12 (see FIG. 7) type power source device A-1 for supplying the gas cleaning device A-2 with electricity as shown in FIGS. 7 and 8.

That is, particles exist in the box 21, which attach to the wafer 22 to cause a possible fault of breakage or short-cut and thereby to lower the yield thereof. These particles enter from the clean room (class 1,000) into the box 21 every time when the box door 23 is opened in order to take the wafer 22 in or out the box 21.

The particles are charged by the photo-electron 33 emitted from the photo-electron emitting material 29 on which the ultraviolet rays are irradiated from the ultraviolet lamp 27, to be changed into charged particles, and then the charged particles are collected by the charged particle collecting member 31, so that a cleaning space section B in which the wafer 22 exists is made a super clean space.

Since the gas cleaning device A-2 is supplied with electricity by the power source device A-1 as described above, the cleaning operation (air cleaning) thereby can be performed for a long period.

Thus, a super clean space cleaner than class 1 can be maintained in the box 21.

In FIG. 11, the same reference numerals as those of FIGS. 9 and 10 denote the same elements.

Embodiment No. 5

Figure 12:
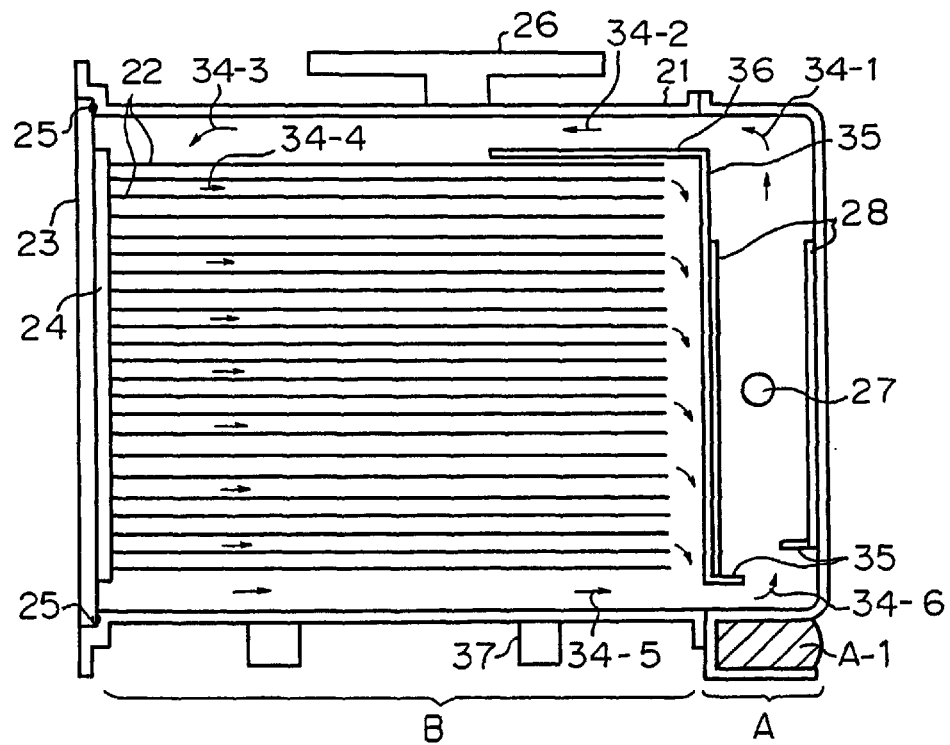
FIG. 12 is a cross sectional view illustrating yet another example of a side opening integral type carrier box according to the present invention.

A wafer carrier box in the semiconductor plant is shown in FIG. 12.

Since, in the present plant, the carrier box is used in a clean space cleaner than class 10, an effect of the particles need not be taken into account, only the removal of the gaseous harmful components is conducted.

The gas cleaning device A-2 in the box 21 of FIG. 12 comprises the ultraviolet lamp 27 and the photo-catalyst 28.

The air cleaning in the box 21 is conducted by the gas cleaning unit A (A-1+A-2) comprising the gas cleaning device A-2 and the rechargeable battery type power source device A-1 for supplying the gas cleaning device A-2 with electricity as shown in FIGS. 7 and 8.

That is, there is H.C. or $NH_3$ as a gaseous harmful component (harmful gas) in the box 21, which attaches to the wafer 22 to increase the contact angle of the wafer.

These harmful gases enter from the clean room into the box 21 every time when the box door 23 is opened in order to take the wafer 22 in or out the box 21. In addition, depending on the kind of the wafer, there may be an outgassing from the surface of the wafer (the harmful gas may be generated).

These harmful gases are decomposed by the photo-catalytic action of the photo-catalyst 28 on which the ultraviolet rays are irradiated from the ultraviolet lamp 27 to be transformed into configurations which do not increase the contact angle, so that the cleaning space section B in which the wafer 22 exists is made a super clean space.

Since the gas cleaning device A-2 is supplied with electricity by the power source device A-1, the cleaning operation (air cleaning) thereby can be performed for long time period. Even if the harmful gas is generated from the surface of the wafer 22, the space in the box 21 can be cleaned in a self-cleaning manner.

Thus, the harmful gases in the air within the box 21 are processed and the air in the box 21 is made clean, including minimal harmful gas, whereby the contact angle on a substrate such as wafer received therein does not increase. (For example, H.C. concentration of 0.1 ppm or lower and $NH_3$ concentration of 1 ppb or lower could be accomplished).

In FIG. 12, the same reference numerals as those of FIGS. 9 and 10 denote the same elements.

Reference No. 5

Figure 13:
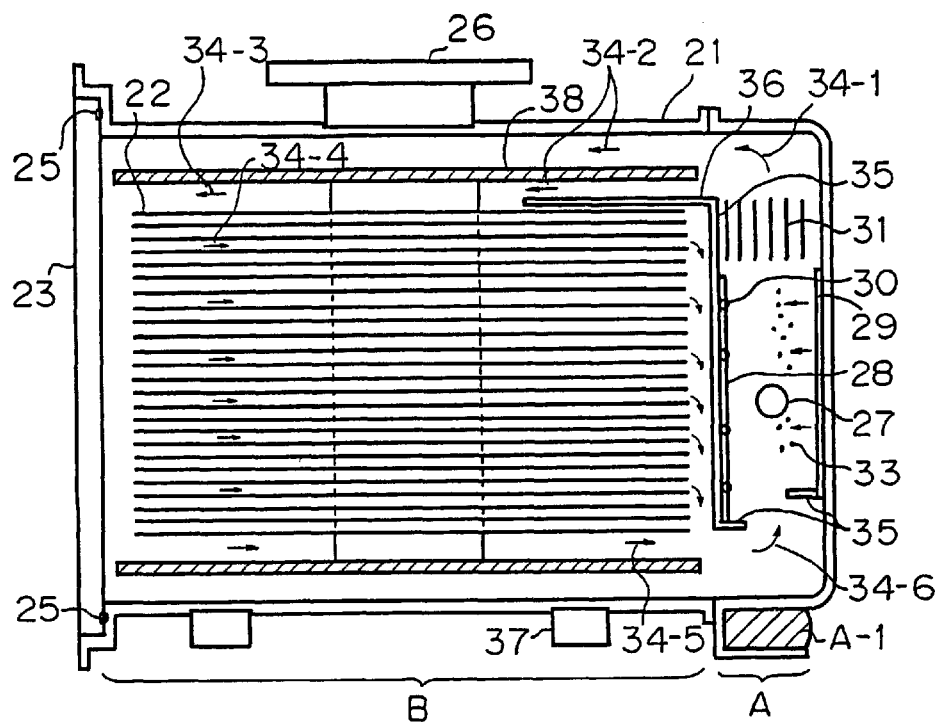
FIG. 13 is a cross sectional view illustrating an example of open cassette container type side opening carrier box of Reference No. 5.

Another type of wafer carrier box 21 than that of Reference No. 4 shown in FIGS. 9 and 10 is shown in FIG. 13. FIG. 13 shows an open cassette container type side opening carrier box in which an open cassette 38 containing the wafer 22 is housed in the box of FIGS. 9 and 10. In an opening and closing mechanism of this box, there is no wafer retainer (FIGS. 9, 11 and 12) since the wafer 22 is held in the open cassette 38. In FIG. 13, the same reference numerals as those of FIGS. 9 and 10 denote the same elements.

Reference No. 6

Figure 14:
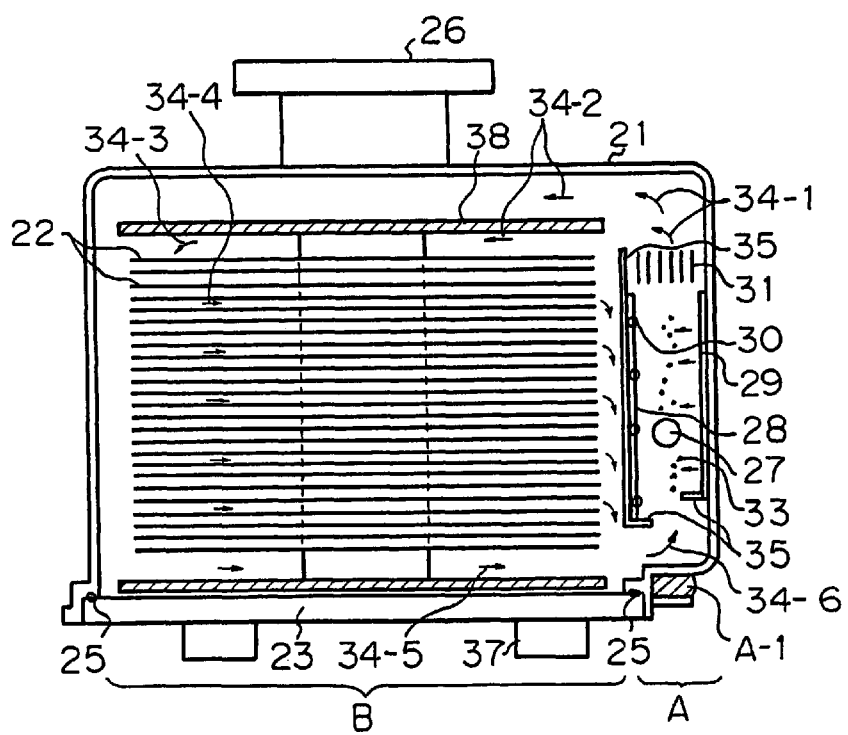
FIG. 14 is a cross sectional view illustrating an example of open cassette container type bottom opening carrier box of Reference No. 6.

Still another type of wafer carrier box 21 different to that of Reference No. 4 shown in FIGS. 9 and 10 is shown in FIG. 14. FIG. 14 shows an open cassette container type bottom opening carrier box in which the box 21 has at a bottom thereof an opening and closing mechanism comprising a box door 23 and a sealing member 25.

That is, this box 21 is a bottom opening type, and the opening and closing mechanism of the box 21 comprising the box door 23 and the sealing member 25 is operated by engaging an opener having elevator mechanism (not shown) with the box door 23 and lowering them vertically downward under a condition where the box is lifted up, and thereby the box door 23 is opened.

An inside of the box 21 is used to receive the open cassette 38 containing the wafer 22.

In FIG. 14, the same reference numerals as those of FIGS. 9 and 10 represent the same elements.

Embodiment No. 6

The wafer carrier box with a configuration shown in FIGS. 11, 12 was placed in a class 1,000 semiconductor plant, and the gas cleaning unit comprising the cleaning device shown in FIGS. 11, 12 for removing the harmful gas or particles and the rechargeable battery type electric power source device having a constitution shown in FIGS. 7, 8 for supplying the cleaning device with electricity is housed in the carrier box, and, after a sample gas shown below was introduced into the box and ultraviolet rays were irradiated, the contact angle on the wafer received in the wafer carrier box and the concentrations of the particles and non-methane hydro-carbon in the box were measured.

The electric power source device is supplied with electricity from the power supply device of the stocker in the clean room.
1) Size of the carrier box: 35 liters, made of P.C.
2) Cleaning device
   (1) Ultraviolet ray source: Bactericidal light 4W
   (2) Photo-catalyst material: Al sheet with $TiO_2$ added thereon by sol-gel method
   (3) Photo-electron emitting material: Al sheet with Au added thereon
   (4) Electrode for emitting photo-electron: grid-shaped shaped SUS, 20V/cm
   (5) Charged particle collecting member (electrode sheet): SUS sheet, 800V/cm
3) Electric Power Source Device
   (1) Charging circuit: with voltage monitor for charging the battery under optimal condition
   (2) Battery: Li-ion battery
   (3) Electric power source: with DC/DC converter and DC/AC converter for supplying necessary kinds of voltages to the cleaning device (for lightening the bactericidal lamp: 20–50 kHz AC voltage; for the electrode for emitting the photo-electron: DC 100V; for the charged particle collecting member: DC 1,000V)
   (4) Electronic components with high heat generation used to accelerate air circulation:
       DC/DC converter; DC/AC converter; Power transistor & power EFT used in the charging circuit
   (5) Radiation board: Al sheet (thickness: 2 mm)
4) Sample gas (inlet)
   Medium gas: air
   Particle concentration: class 1,000
   Non-methane hydro-carbon concentration: 1.5 ppm
5) Wafer: 12 inches×13 sheets
6) Measuring instrument
   Contact angle: waterdrop type contact angle measuring instrument
   Particle concentration: particle counter by light scattering method (>0.1 $\mu$m)
   Non-methane hydro-carbon concentration: gas chromatograph
   Where, the particle concentration (class) indicates a total number of particles with a diameter more than 0.1 $\mu$m included in 1 $ft^3$.

Figure 16:
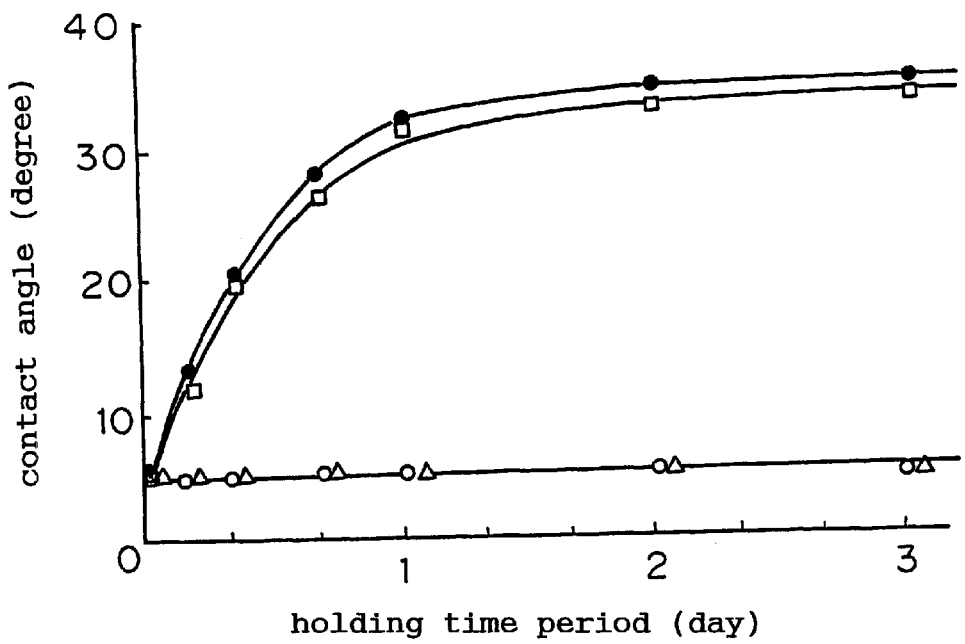
FIG. 16 is another diagram illustrating a variation of a contact angle (degree) as a function of a holding period (day)

TEST RESULT (1) Contact Angle on the Wafer
   The contact angle on the wafer received in the box is shown as a function of holding period in FIG. 16. In FIG. 16, a case where the cleaning is conducted by both of the photo-catalyst and the photo-electron is shown by -○-, another case where the cleaning is conducted only by the photo-catalyst of the present invention is shown by -△-, another case where the cleaning is conducted only by the photo-electron is shown by -□-, and the last case where no cleaning is employed is shown by -●-.
(2) Particle Concentration in the Box (Class)
   The particle concentrations (classes) in the box after an hour, two hours, one day and a week are shown in Table 3. For comparison, the case where the cleaning is conducted by both of the photo-catalyst and the photo-electron, and another case where no cleaning is employed are shown also in Table 3.

TABLE 3

| | value: class | | | |
|---|---|---|---|---|
| Cleaning condition | After 1 hour | After 2 hours | After 1 day | After 1 week |
| Photo-electron & Photo-catalyst | <1 | <1 | <1 | <1 |
| Photo-catalyst only | 1000 | 800 | * | * |
| Photo-electron of the present invention only | <1 | <1 | <1 | <1 |
| Non-cleaning | 1000 | 900 | * | * |

*: not measured (3) Non-methane Hydro-carbon Concentration in the Box (ppm)
   The test was conducted in the same manner as above, and the test result is shown in Table 4.

TABLE 4

| | value: ppm | | | |
|---|---|---|---|---|
| Cleaning condition | After 1 hour | After 2 hours | After 1 day | After 1 week |
| Photo-electron & Photo-catalyst | <0.1 | <0.1 | <0.1 | <0.1 |
| Photo-catalyst of the present invention only | <0.1 | <0.1 | <0.1 | <0.1 |
| Photo-electron only | 1.3 | 1.2 | 1.2 | 1.1 |
| Non-cleaning | 1.4 | 1.4 | 1.4 | 1.3 |

Figure 17:
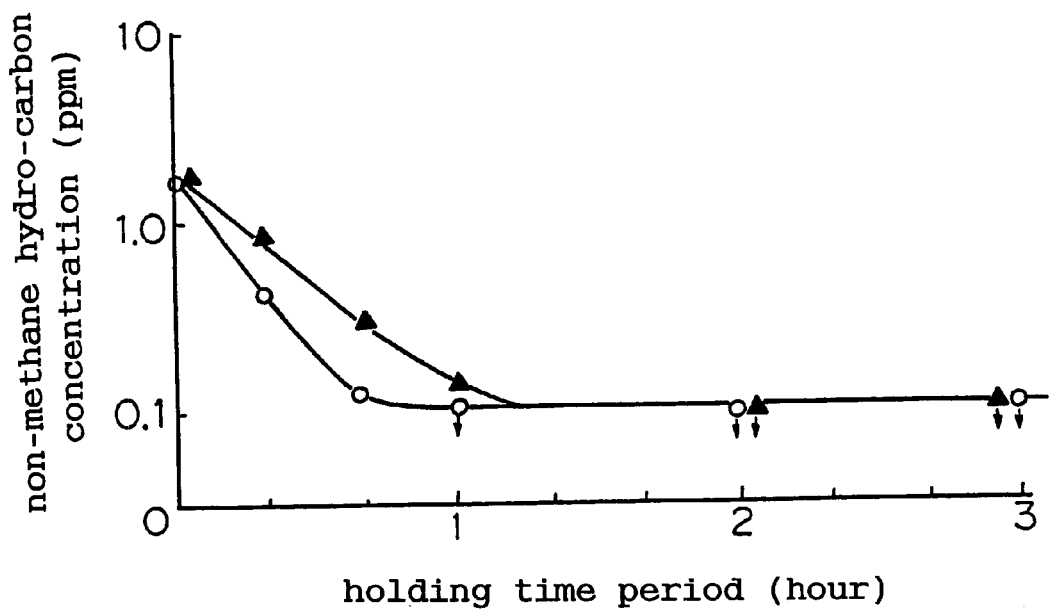
FIG. 17 is a diagram illustrating a variation of a concentration of non-methane hydrocarbon (ppm) as a function of a holding period (hour)
Figure 18:
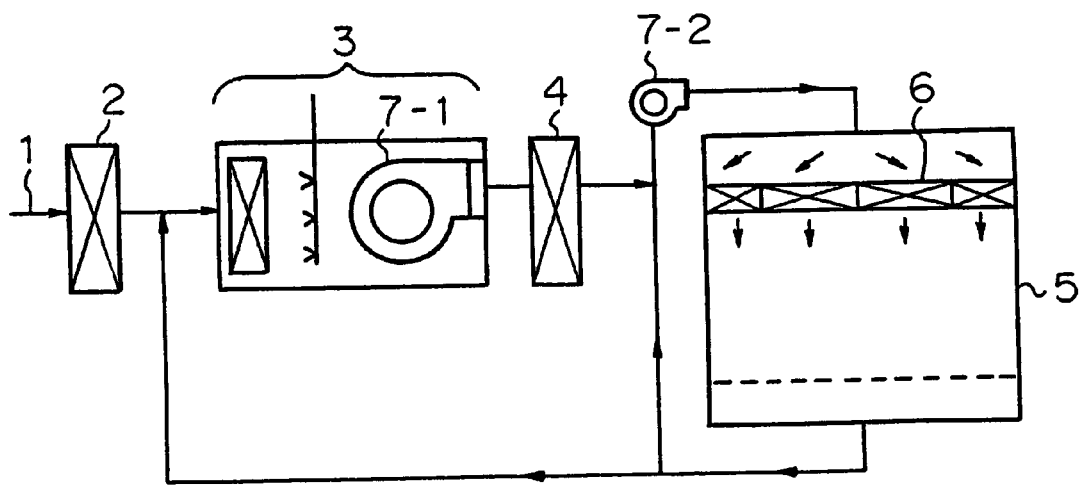
FIG. 18 is a schematic drawing illustrating air cleaning in a conventional air room.

In order to confirm an effect on the wafer resulting from an operation to remove non-methane hydro-carbon in the space, the wafer is received in the box under the condition described above and ester phthalate (DOP, DBP) on the wafer is inspected.
   Measuring method: After the wafer was exposed to the air under the above condition for 16 hours, deposits on the wafer are desorbed and ester phthalate therein is measured by GC/MS method.
   In every case with no photo-catalyst installed, ester phthalate was detected.
   On the contrary, in the cases with the photo-catalyst of the present invention installed, no ester phthalate was detected.
   In the case with the photo-catalyst of the present invention installed, the result of the test conducted with the radiation board removed is sown in FIG. 17. The diagram shows a relation between the concentration of non-methane hydro-carbon and the holding time period. In FIG. 17, -○-shows the test result in the case of the present invention while -▲- shows that without the radiation board. It is found from FIG. 17 that the removing operation of the present cleaning device is accelerated by installing the radiation board.
   In FIG. 17, ↓ show that "the value is less than a limit of detection (0.1 ppm)".

EFFECT OF THE INVENTION

As has been described in the foregoing, the present invention provides the effects stated below.
1) The carrier box for the semiconductor substrate of the present invention has an opening and closing mechanism and is provided with the gas cleaning device which uses a photo-electron or the photo-catalyst for cleaning the inside of the box, or the gas cleaning device and a rechargeable battery-type power source device for supplying the gas cleaning device with electricity, so that:
   (1) The inside of the box can be cleaned by the gas cleaning device, and further, since the cleaning device is supplied with electricity from the electric power source device, a cleaning operation can be conducted continuously for long time period;

(2) owing to the opening and closing mechanism, the box can be handled by the robot;

(3) in installing the gas cleaning device, either of the photo-electron cleaning system (for removing particles only) or the photo-catalyst system (for removing gaseous harmful components only) can be properly selected depending on the kind of the applied box, required performance, economic efficiency or the like, that is, the efficient cleaning system can be realized in practical use and the scope of application may be extended;

(4) particles and the gaseous harmful components in the box (wafer receiving space) can be efficiently removed, that is, a clean space can be easily created in which cleanliness is superior to class 1 from a viewpoint of removal of particles, and a contact angle does not increase from the viewpoint of removing the gaseous harmful components; and (5) even if a power source device is not provided as an incorporated unit, the cleaning operation conducted by the cleaning device of the present invention can be preformed efficiently for a long period by installing a power supply device in a place remote from transportation, for example, in a load port, stocker or stand-by station since the substrate receiving box is subject to a relatively rather long halting period in such place as compared with that for actual transportation.

2) In the cleaning operation conducted by the gas cleaning device according to 1) above, the gas flow in the box is accelerated by transmitting heat generated in the power source device to the gas cleaning device, and this enables more efficient removal of contaminants by a photo-electron or photo-catalyst.

3) The gas cleaning device according to 1) above is integrated with the box into one unit and also is made detachable from the box, so that:

(1) the gas cleaning device can be separated from the cleaning space section of the box, which facilitates maintenance and control service of the cleaning space section and the gas cleaning unit; and (2) the gas cleaning device can be attached not only to the box of the present invention but also to other suitable boxes, which extends the scope of application thereof.

4) As a result of the facts described above:

(1) not only the contaminants entering into the box during taking the substrate in or out thereof, but also those resulting from outgassing or dusting from the surface of the substrate or the box materials can be removed, which provides a super clean space in the box in a self-cleaning manner;

(2) A plastic material can be used for the structural members of the box in spite of possible outgassing, which is advantageous in practical use because of their light weight;

(3) the box can be used also as a stock box (stocker) since the electric power source device supplies electricity and thereby the cleaning operation is continuously conducted (a super clean space is maintained);

(4) a useful box is provided in practical use, which allows the box to be applied in an extensive field of substrate carrier box;

(5) an application range is extended and a utility thereof is improved; and (6) even in an expected future stage where semiconductors will be required to be of even higher quality, of more micro-structured and of higher precision, and substrates thereof will be required to be of a larger size, and also the usage of robots and substrates receiving boxes will be an inevitable requirement, the box of the present invention will be able to be suitably used as a substrate receiving box (for transportation and stock) in the future processes.

What is claimed is:

1. A carrier box for a semiconductor substrate, comprising:

an opening and closing mechanism for taking said semiconductor substrate in or out of said box; and a gas cleaning unit including a gas cleaning device which uses a photo-electron or a photo-catalyst actuated by light irradiation for cleaning an inside of said box, said gas cleaning unit detachably attached to the box so as to cover almost all of one side surface of said box.

2. A carrier box for a semiconductor substrate, comprising:

an opening and closing mechanism for taking said semiconductor substrate in or out of said box;

a gas cleaning unit including a gas cleaning device which uses a photo-electron or a photo-catalyst actuated by light irradiation for cleaning an inside of said box; and a rechargeable battery capable of supplying said gas cleaning device with electricity, said gas cleaning unit detachably attached to the box so as to cover almost all of one side surface of said box.

3. A carrier box in accordance with either of claim 1 or 2, in which said carrier box is made of synthetic resin.

4. A carrier box in accordance with claim 2, in which said gas cleaning unit is provided with a heat radiator for transmitting heat generated in said electric power source device to said gas cleaning device.

* * * * *

UNITED STATES PATENT AND TRADEMARK OFFICE
CERTIFICATE OF CORRECTION

PATENT NO. : 6,395,240 B1
DATED : May 28, 2002
INVENTOR(S) : Fujii et al.

It is certified that error appears in the above-identified patent and that said Letters Patent is hereby corrected as shown below:

<u>Title page,</u>
Item [87], the PCT information should read:
--  [87]  PCT Pub. No.:  WO99/28966
         PCT Pub. Date:  Jun. 10, 1999 --

Signed and Sealed this

Fifth Day of November, 2002

Attest:

Attesting Officer

JAMES E. ROGAN
*Director of the United States Patent and Trademark Office*